(12) United States Patent
Huang et al.

(10) Patent No.: US 6,647,524 B1
(45) Date of Patent: Nov. 11, 2003

(54) BUILT-IN-SELF-TEST CIRCUIT FOR RAMBUS DIRECT RDRAM

(75) Inventors: Shi-Yu Huang, Tainan (TW); Ding-Ming Kwai, Taipei (TW)

(73) Assignee: Worldwide Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 09/303,770

(22) Filed: Apr. 30, 1999

(51) Int. Cl.[7] ............................................... G01R 31/28
(52) U.S. Cl. ....................... 714/734; 714/733; 714/736
(58) Field of Search ........................... 714/734, 735–45, 714/724, 725–33; 324/73; 326/16, 21; 365/63, 230.03, 230.08, 230.06, 189.05; 327/291, 293, 299, 99

(56) References Cited

U.S. PATENT DOCUMENTS

| | | | | |
|---|---|---|---|---|
| 5,655,113 A | * | 8/1997 | Leung et al. ................. 713/401 |
| 5,729,152 A | * | 3/1998 | Leung et al. ................... 326/21 |
| 5,748,557 A | * | 5/1998 | Kang ....................... 365/230.08 |
| 5,818,772 A | * | 10/1998 | Kuge .......................... 365/201 |
| 5,844,438 A | * | 12/1998 | Lee .............................. 327/291 |
| 6,182,253 B1 | * | 1/2001 | Lawrence et al. ............ 714/718 |
| 6,272,577 B1 | * | 8/2001 | Leung et al. ................. 710/110 |

* cited by examiner

Primary Examiner—Albert Decady
Assistant Examiner—Guy Lamarre
(74) Attorney, Agent, or Firm—Blakely Sokoloff Taylor & Zafman, LLP

(57) ABSTRACT

A built-in-self-test (BIST) circuit for RAMBUS DRAM is disclosed. Unlike other conventional memory devices, a RAMBUS DRAM operates at a much higher speed (e.g., 400 MHz) with a complicated protocol imposed on its input stimuli. In order to provide at-speed testing, a new BIST architecture is needed. The new architecture consists of three major components—two interacting finite state machines (FSMs) and a high-speed time-division multiplexer. The two finite state machines, defining the underlying test algorithms jointly, are used to generate a sequence of generic memory commands. Through the time-division multiplexer, each memory command is then further mapped into a multi-cycle packet compliant to the specification of a target RAMBUS DRAM. Among these components, the finite state machines often form the performance bottleneck. A simple master-slave synchronization mechanism is used to convert these two finite state machines into a multi-cycle path component, thereby eliminating the timing criticality.

4 Claims, 8 Drawing Sheets

BUILT-IN-SELF-TEST CIRCUIT FOR RAMBUS DIRECT RDRAM

FIELD OF THE INVENTION

The present invention relates to the built-in-self-test (BIST) of dynamic random access memory (DRAM), and more particularly, to a BIST circuit for RAMBUS DRAM.

BACKGROUND OF THE INVENTION

One objective of built-in self-test (BIST) for random access memory is to translate a test algorithm into a sequence of commands, data, and addresses to be applied to the memory under test. In the prior art, a variety of techniques have been utilized to provide BIST for RAM. Traditionally, a hard-wired finite state machine is used to implement the translation process. To provide the capability of at-speed testing, the BIST circuit operates as fast as the memory under test. A disadvantage of the approach is that the finite state machine is tailored into a specific set of test patterns whose complexity depends on the test algorithm. As the complexity of the test algorithm increases, this approach may be inadequate because the finite state machine may become too large and too slow to produce a test pattern in each clock cycle to intensively exercise the memory under test.

Other BIST circuits, known to be programmable or configurable, provide certain flexibility by configuration variables that determine specific test patterns and sequences to be applied to the memory array. For example, U.S. Pat. No. 5,173,906 entitled "Built-in Self Test for Integrated Circuits" (issued Dec. 22, 1992 to Dreibelbis et al.) discloses a circuit that provides both fixed and programmable test patterns for a RAM array. U.S. Pat. No. 5,224,101 entitled "Micro-Coded Self-Test Apparatus for a Memory Array" (issued Jun. 29, 1993 to Popyack, Jr.) discloses a circuit that uses a micro-coded sequence defined in the contents of a read-only memory to produce the test patterns.

U.S. Pat. No. 5,301,156 entitled "Configurable Self-Test for Embedded RAMS" (issued Apr. 5, 1994, to Talley) discloses a circuit that has a serial path that passes through the address, command, and data portions of the circuit to shift in a test or control pattern and to shift out the results, each scan requiring several clock cycles.

However, a need still exists for a BIST circuit specifically adapted for a RAMBUS DRAM memory.

SUMMARY OF THE INVENTION

A built-in-self-test (BIST) circuit for RAMBUS DRAM is disclosed. Unlike other conventional memory devices, a RAMBUS DRAM operates at a much higher speed (e.g., 400 MHz) with a complicated protocol imposed on its input stimuli. In order to provide at-speed testing, a new BIST architecture is needed. The new architecture consists of three major components—two interacting finite state machines (FSMs) and a high-speed time-division multiplexer. The two finite state machines, defining the underlying test algorithms jointly, are used to generate a sequence of generic memory commands. Through the time-division multiplexer, each memory command is then further mapped into a multi-cycle packet compliant to the specification of a target RAMBUS DRAM. Among these components, the finite state machines often form the performance bottleneck. We therefore use a simple master-slave synchronization mechanism to convert these two finite state machines into a multi-cycle path component, thereby eliminating the timing criticality.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENT

Figure 1:
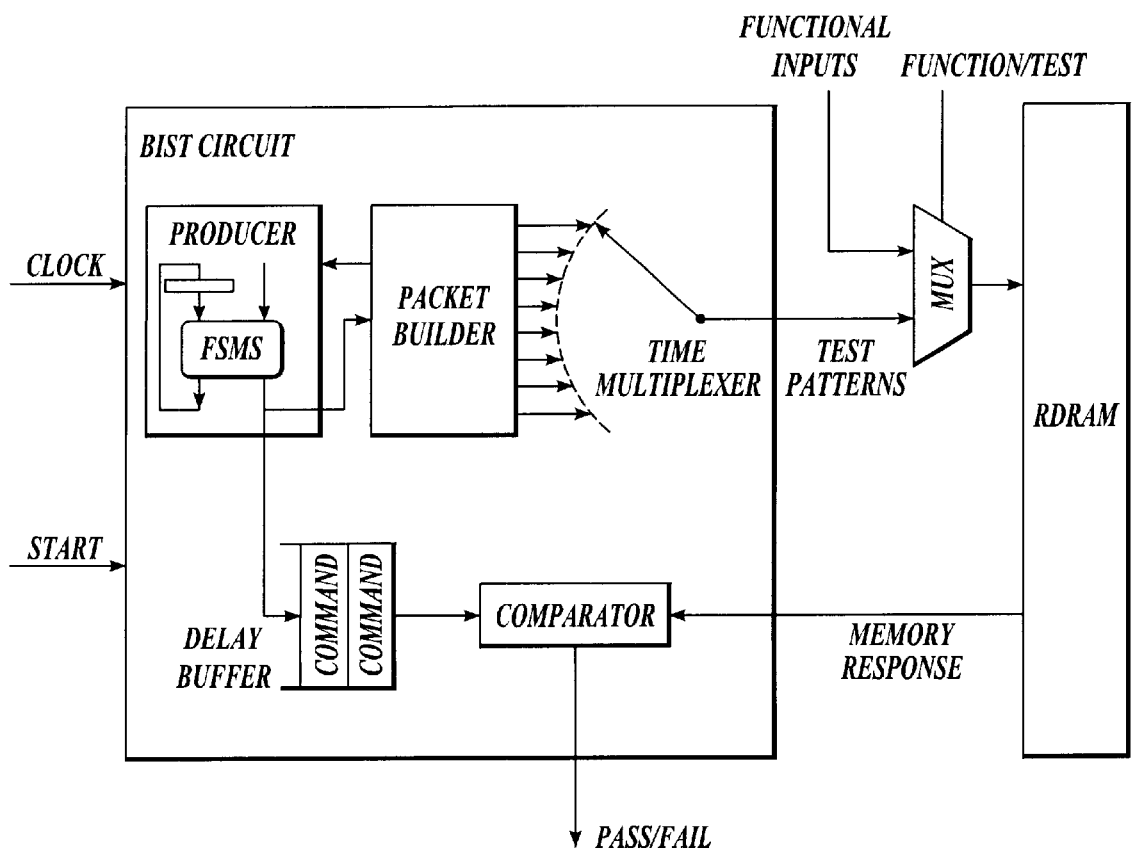
FIG. 1 is a schematic illustration of the architecture of the present invention.

Turning to the present invention, we first introduce the terminology used herein. Then, the basic architecture is described. Finally, synthesis results are presented.

4.1. Terminology

Definition 1: (memory command): A memory command refers to a basic activity of the DRAM under test. Five memory commands—{mem_nop, mem_active, mem_read, mem_write, mem_precharge}—are incorporated in this design, where mem_nop: performs no operation.

mem_active: activates a wordline of a specific memory bank.

mem_read: issues a memory read command.

mem_write: issues a memory write command, mem_precharge: performs all-bank precharge.

The details of the activities of the DRAM with respect to these commands are referred to A. K. Sharma, Semiconductor Memories, Technology, Testing, and Reliability, IEEE Press, 1996.

Definition 2: (memory operation): The entire sequence of memory commands needed to complete a read/write cycle from/to a specific memory cell is called an operation. For example, a basic READ operation from a memory cell may consist of a sequence of {mem_active→mem_nop→mem_read→mem_nop→mem_precharge}, while a WRITE operation to a memory cell may consist of a sequence of (mem_active→mem_nop→mem_write→mem_nop→mem_precharge).

In addition to the basic READ/WRITE operation, most DRAMs allow more complicated operations such as interleaved or pipelined operations.

Definition 3: (interleaved memory operation): An interleaved operation refers to a complete READ/WRITE cycle that interleaves the memory commands to multiple banks of the DRAM under test. For example, the following sequence shows an interleaved four-bank READ operation with the subscript index denoting the bank identifier: {mem_$active_1$→name_nop→mem- $active_2$→mem-nop→mem-active$_3$→mem-nop→mem-active$_4$mem-nop→mem_
read$_1$→mem_read$_2$→mem read$_3$→mem-read $_4$→mem-nop
mem_precharge}.

Definition 4: (pipelined memory operation): A pipelined memory operation refers to the page-mode access to the DRAM that reads or writes multiple data in a READ/WRITE cycle. In terms of memory commands, it is an operation with a number of consecutive mem_read or mem_write commands, e.g., {mem_active→mem_nop→mem_read→mem_read→mem_read→...→mem_nop→—p mem_precharge}.

Definition 4: (test pattern): A test pattern is a valid input combination to the memory, consisting of five portions: memory command, data value, bank identifier, row address, and column address.

Definition 3: (test algorithm): A test algorithm is an abstract description of a test sequence to be generated by the BIST circuitry.

Example 1: (March algorithm) Assume that the memory array under test has R rows and C columns. A March algorithm could consist of four steps as shown below. The first step writes a 0 to every cell. The second step walks through the entire array in a forward manner (i.e., from the first cell in the first row to the last cell in the last row). At each cell, a so-called READ(O)-WRITE(1)-READ(1) operation is performed. Note that READ-WRITE-READ has been proposed in an attempt to better expose the potential dynamic defects of the memory cells. The third step walks through the entire array from the last cell to the first cell. At each cell, a READ(1)-WRITE(O)-READ(0) operation is performed. The final step checks if every cell's value remains zero after the first three steps.

The March algorithm in psuedocode is as follows:

```
March_algorithm(R, C)
{
/*---step 1: write 0 to each cell ---*/
foreach_row(i=0; i<R; i++){
    foreach_column(j=0- j<C; j++){ Write 0 to cell(i,j); }
}
/*--- step 2: change each cell from 0 to 1 in a forward manner ---*/
foreach_row(i=0; i<R; i++){
foreach_column(j=0; j<C;
Read 0 from cell(i, j)
Write 1 to cell(i, j);
Read 1 from cell(i, j)
    }
}
/*--- step 3: change each cell from 1 to 0 in a backward manner ---*/
foreach_row(i=(R-1); i>=0; i--){
foreach_column(j=(C-1); j>=0; j --
Read 1 from cell(i, j)
Write 0 from cell(i, j);
Read 0 from cell (i, j)
    }
}
/*--- step 4: read 0 to each cell ---*/
foreach_row(i=0; i<R; i++){
    foreach_column(j=0; j<C; j++){ Read 0 from cell(i, j); }
    }
}
```

4.2 The Top-Level Architecture

FIG. 1 shows the block diagram of the proposed design. There are five major components, namely, producer, packet builder, time-multiplexer, delay buffer, and comparator.

(1) Producer is a hierarchical finite state machine that produces a sequence of memory commands. The structure of this machine relates to the underlying test algorithms.

(2) Packet builder is a piece of combinational logic that takes a memory command as the input and then generates its corresponding packet compliant to the specification of the DRAM under test. A packet consists of eight packet slices, each representing an input pattern to be applied to the DRAM at a specific clock edge. More specifically, each slice contains three fields—a 3-bit row field, a 5-bit column field, and a two-byte data field. The details of a packet's format can be found in the "data sheet" of the direct RAMBUS DRAM available from Rambus Inc. of Mountain View, Calif.

(3) Time-multiplexer is a switch that selects one out of the eight input packet slices as the test pattern at each rising and falling clock edge. This component is a round-robin switch in the sense that every packet slice takes it turn to be selected. Whenever the last slice is selected, a flag "packet_is_done" is raised to high for one clock cycle to indicate the end of a packet.

(4) Delay buffer is a first-in-first-out register file between the producer and the comparator. It is primarily used to delay the memory commands and the expected responses of the memory for a number of clock cycles. The number of clock cycles to be delayed depends on the latency of the READ operation defined by the DRAM under test.

(5) Comparator is a piece of combinational logic that compares the output responses of the memory with the expected values generated by the delay buffer to determine if the memory is functionally correct.

4.3 Interacting Finite State Machines for Memory Command Generation

The main objective of the BIST circuitry of the present invention is to translate a number of high-level abstract test algorithms into a sequence of test patterns. Traditionally, a finite state machine is used to model the translation process. As mentioned earlier, the modem DRAM operations, such as interleaved or pipelined operations, are much more complicated than the conventional memory devices such as SRAM. In order to provide appropriate test patterns for these sophisticated operations, a new architecture is needed.

Figure 2:
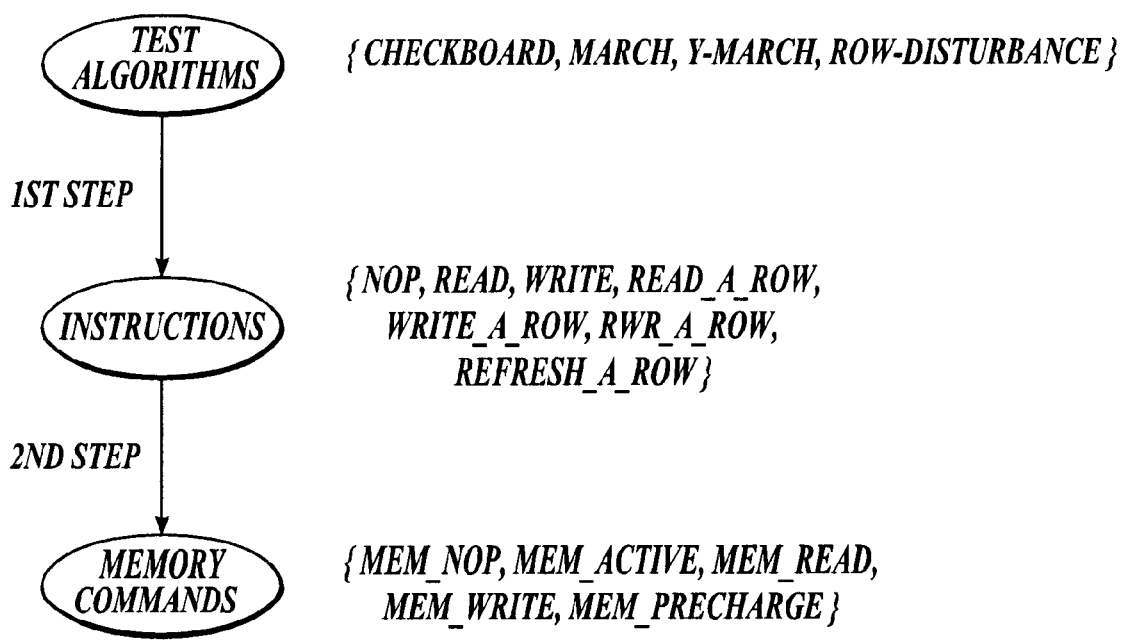
FIG. 2 is a flow diagram illustrating of the BIST circuit of the present invention translates a test algorithm.

In the architecture of the present invention, we incorporate two interacting finite state machines to do the translation in two steps (as illustrated in FIG. 2). First of all, the abstract test algorithm is translated into a sequence of instructions (defined below). Then, each instruction is further interpreted into a sequence of memory commands with the corresponding read/write data value, cell address, and bank identifier. In this design, we implemented four common test algorithms for DRAM testing - CheckerBoard, X-March, Y-March, and Row Disturbance.

Definition 5: (instruction) is a simple or sophisticated memory read/write operation. In the sequel, an instruction is expressed by a four-tuple (opcode, data, row-address, column-address), where data, row-address, and column-address could be "don't care" if represented as *. Overall, we use the following seven types of instructions in the design:

(NOP, *, *, *): represents a no-operation instruction.

(READ, v, r, c): reads an expected value v from the cell with a row address r and a column address c. This instruction corresponds to a basic read operation.

(WRITE, v, r, c): writes a binary value v to the cell with a row address r and a column address c. This instruction corresponds to a basic write operation.

(READ_A_ROW, v, r, *): reads an expected value v from every cell with a row address row sequentially.

(WRITE_A_ROW, v, r, *): writes a binary value v to every cell with a row address row sequentially.

(RWR_A_ROW, v, r, *): performs the READ-WRITE-READ operation to every cell in row r sequentially. The three data values for the operation depends on the value v. If v is 0, then READ(0)-WRITE(1)-READ(1) is performed. On the other hand, if v is 1, then READ(1)-WRITE(0)-READ(0) is performed.

(REFRESH_A_ROW, *, r, *): refreshes the contents of every cell with a row r.

Figure 3:
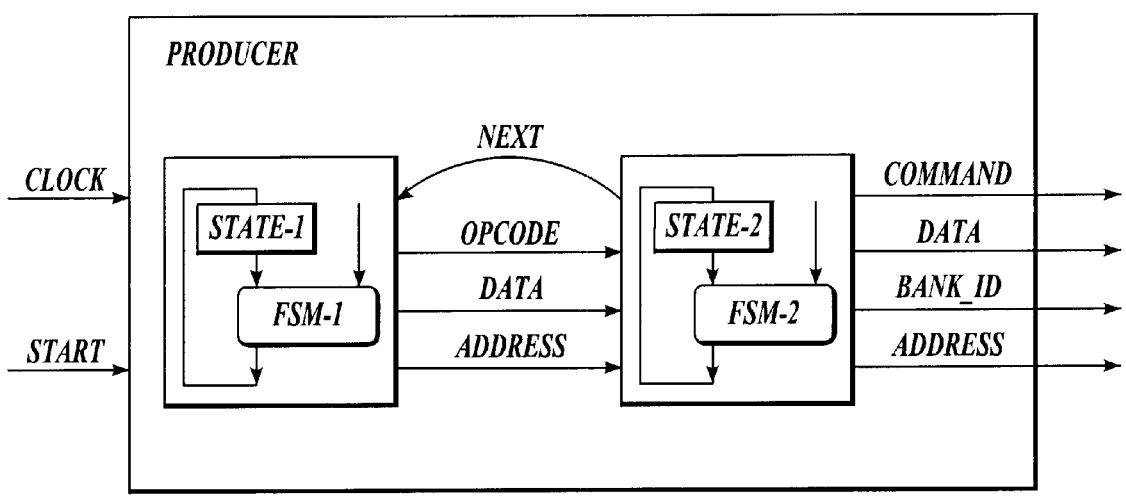
FIG. 3 is a schematic illustration of the component "producer" used in the present invention.

Two finite state machines ("FSM") in the component producer (as shown in FIG. 3) are incorporated to realize the two-step translation process. The first finite state machine is used to generate instructions, while the second machine is used to interpret instructions into memory commands. Along with the memory commands, the second machine also produces the corresponding read/write data value, cell address, and the bank identifier. The interaction between these two machines are regulated through a signal denoted as next' based on the concept of master-slave synchronization. The second machine is the master machine that generates the signal next'. Whenever the interpretation of an instruction is finished, the signal next' is raised to high to call for the next instruction. On the other hand, the first machine is a slave machine that only reacts under the control of the second machine, i.e., it takes a state transition from the current state to the next state only when the signal next' is high. The following examples illustrate the cooperation of these two machines for memory command generation.

Figure 4:
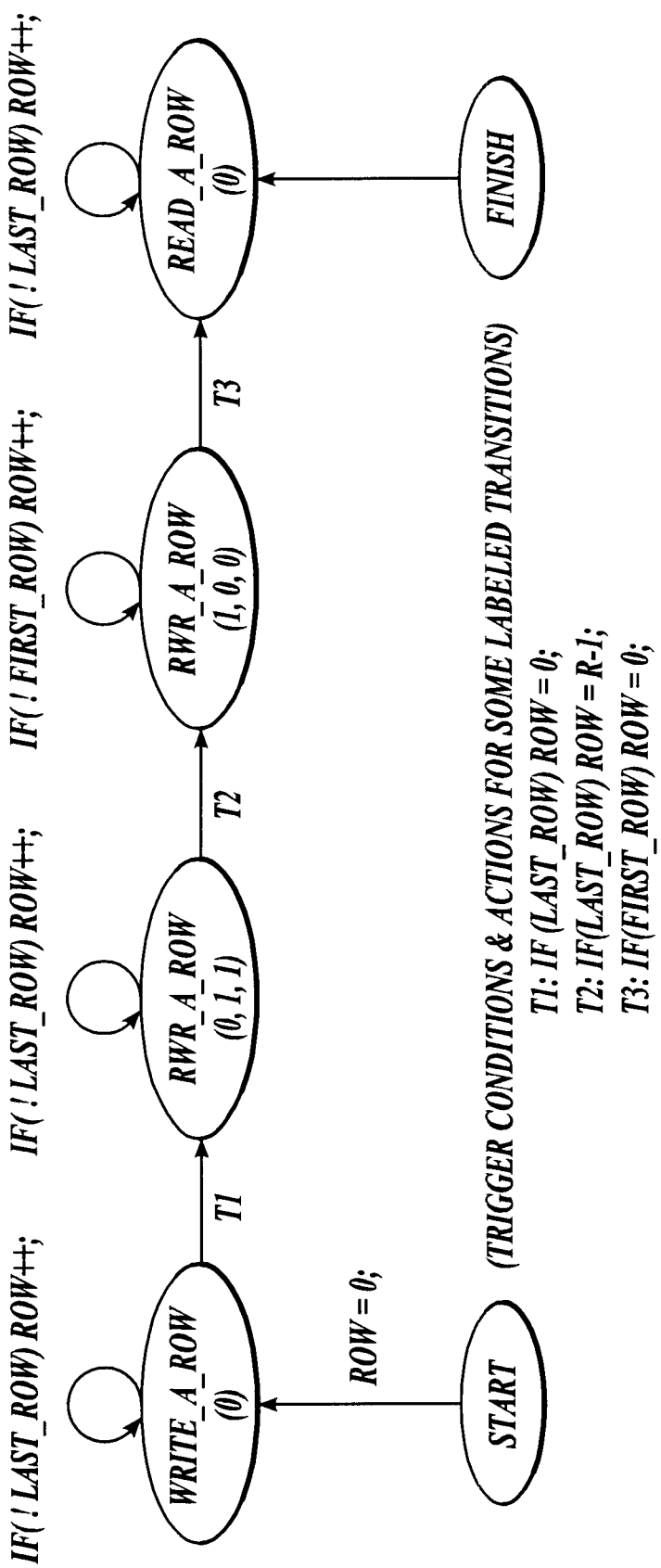
FIG. 4 is a state transition graph for the March algorithm.

Example 2: Assume that the memory array under test has R rows and C columns. FIGS. 4 and 5, respectively, show the state transition graphs of the two state machines for implementing the March algorithm (outlined in Example 1). Both machines operate along with an incrementer that keeps track of the row address and/or column address (represented by variables row and col). The first machine (FIG. 4) contains only six symbolic states including the states START and FINISH. Each transition is associated with a trigger condition and an operation. The trigger condition is the condition under which a transition is fired, while the operation is the action(s) to be taken along with the transition.

For example, if the present state is the state labeled WRITE_A_ROW(0) and the row address is the last (i.e., row=R-1), then the machine will take the transition labeled T1 and the following actions:

produce an instruction (WRITE_A_ROW, 0, row, *).

set the variable row to 0.

go to the next state labeled RWR_A-ROW(0, 1, 1)'.

Figure 5A:
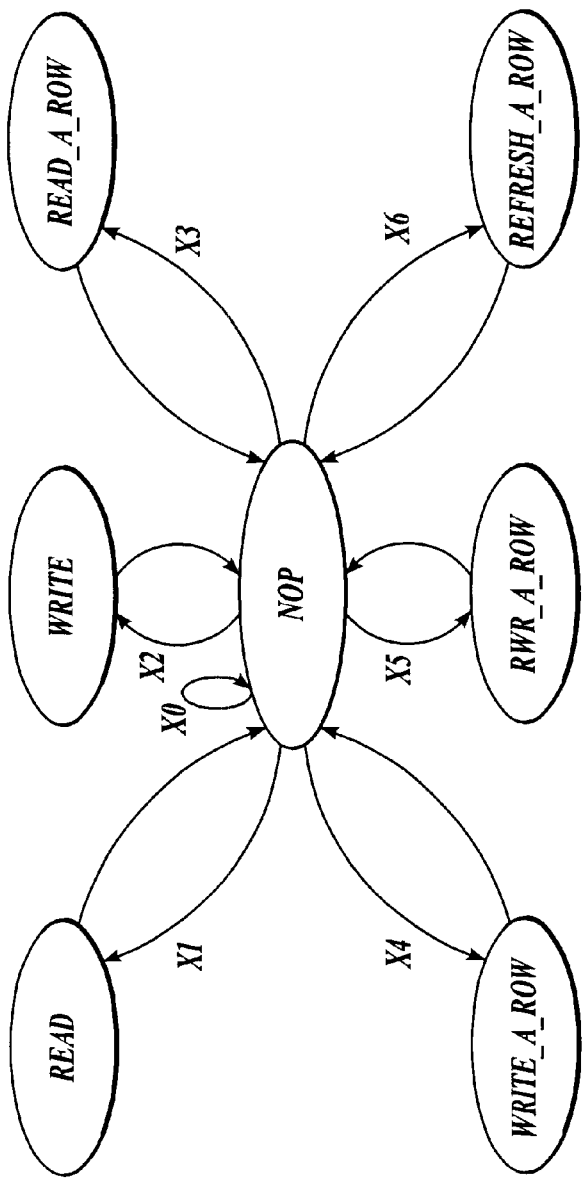
FIG. 5A is a state transition graph one of the finite state machines used in the producer component.
Figure 5B:
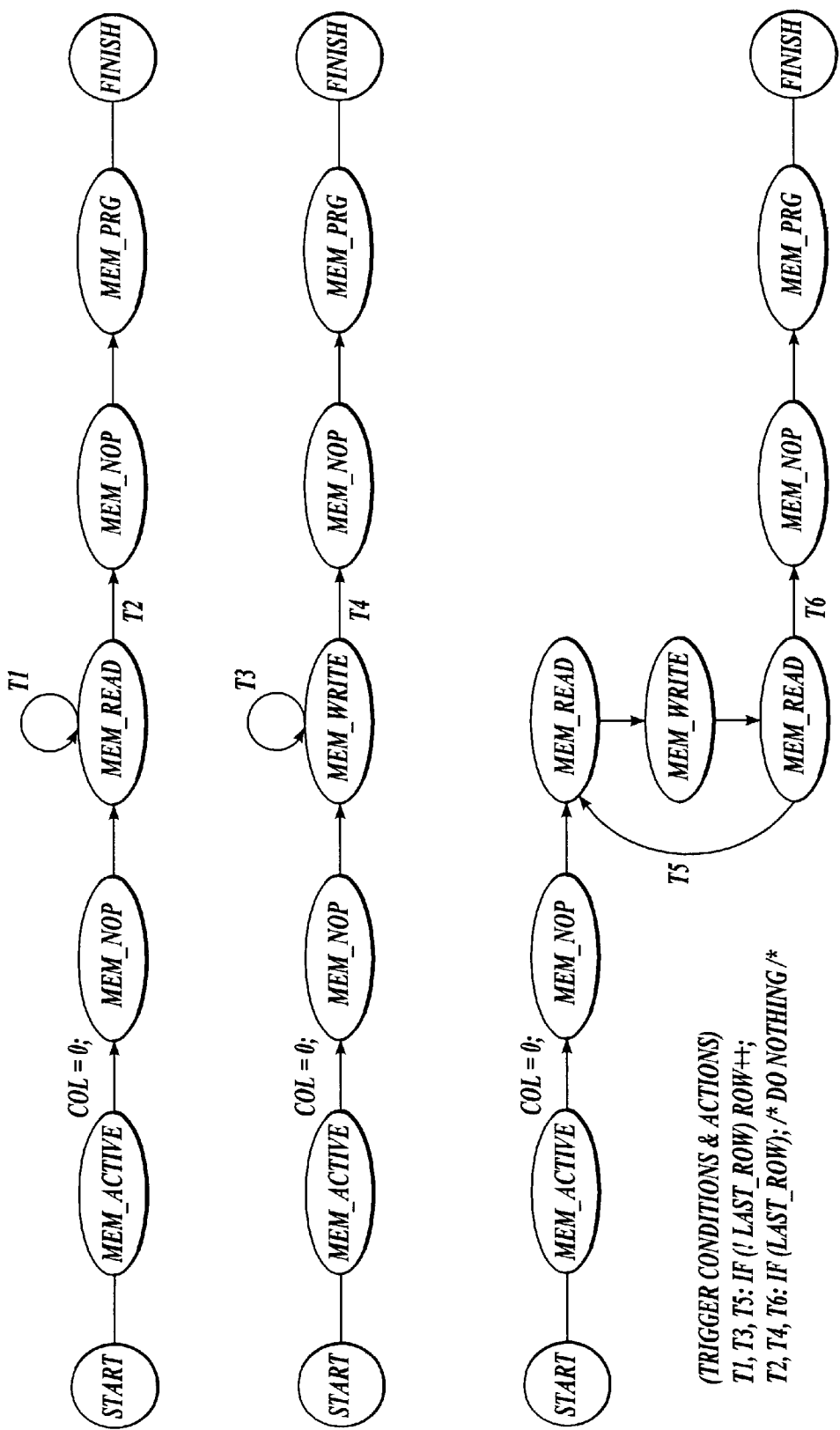
FIG. 5B is a illustration of the sub-machines used for interpreting various instructions.

The second machine (FIG. 5(a) and FIG. 5(b)), taking the instructions generated by the first machine as inputs, is a hierarchical state machine with seven sub-machines. Each sub-machine is used to interpret one type of instruction. For simplicity, only the three sub-machines needed for the March algorithm described in Example 1 is shown (i.e., READ_A_ROW, WRITE_A_ROW, and RWR_A_ROW). Note that more sophisticated test algorithms may need all types of instructions.

4.4 Packet Generation and Time-Multiplexing

Figure 6:
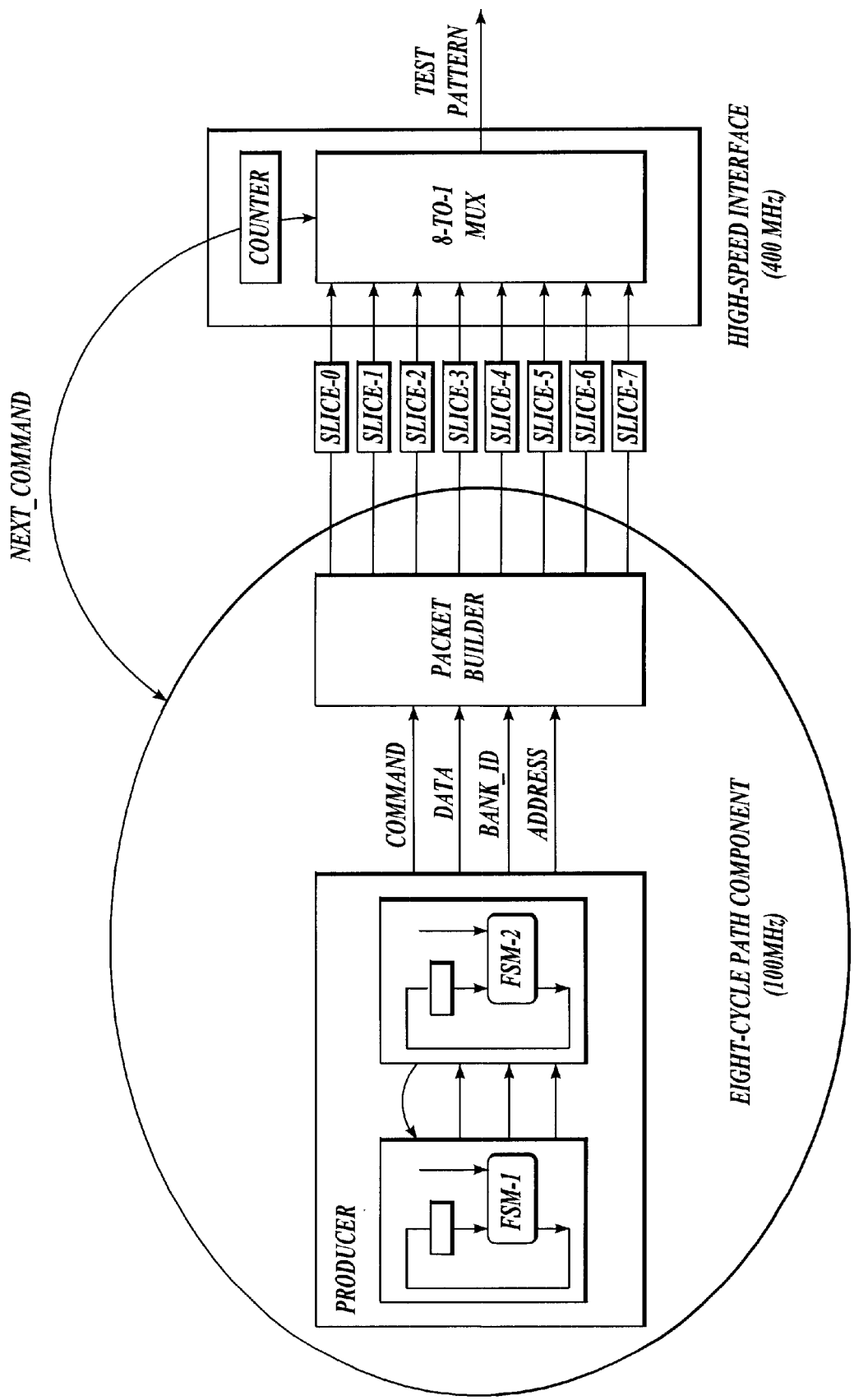
FIG. 6 is a schematic diagram illustrating the interaction between the high-speed interface and the eight-cycle path component.
Figure 7:
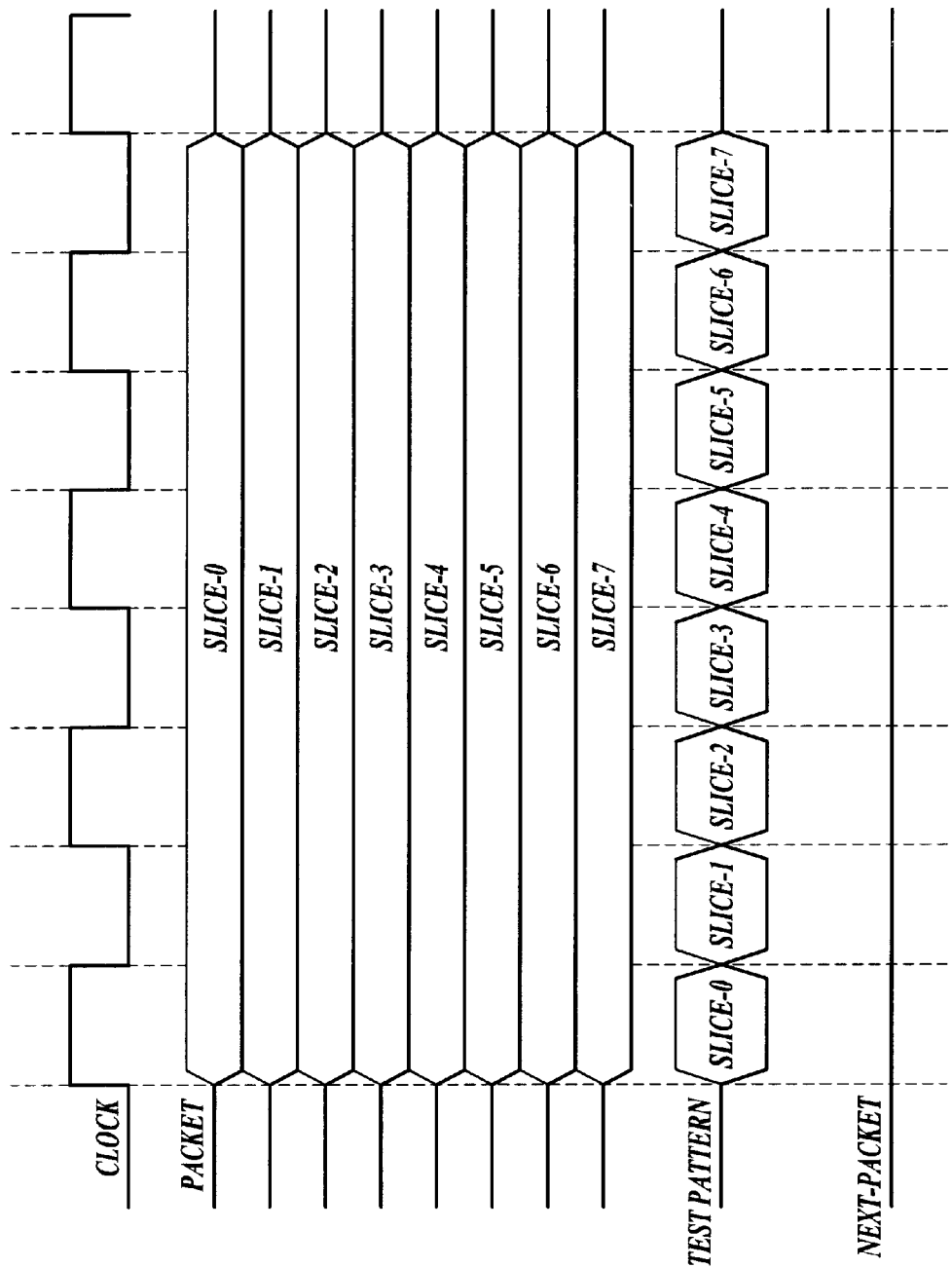
FIG. 7 is a schematic diagram showing an example input/output waveform of the time-multiplexer used in the present invention.

As shown in FIG. 6, a memory command is mapped into a packet consisting of eight slices through the component packet builder. The logic of this packet builder is not described in detail here because it directly follows the specification of the underlying direct DRAM. The generated eight slices are further selected in a round-robin manner to be the test pattern through a time-multiplexer at each clock rising and falling edge. For example, suppose that the eight slices of a packet are slice-0, slice-1, slice-2, slice-3, slice-4, slice-5, slice-6, and slice-7. Then the sequence of the test patterns is shown in FIG. 7.

When the last slice is selected, a flag denoted as packet_done' is raised to high indicating the end of a packet's processing. The signal serves as a means of master-slave synchronization between the time-multiplexer, the producer, and the packet builder. The time-multiplexer is the master component that creates the control signal, while the producer and packet builder are the slave components that operate only when the control signal packet_done' is high. Since it takes four clock cycles (or eight half clock cycles) to process a packet, the signal packet_done' will only go high for one clock cycle in every four clock cycles. This implies that the producer and packet builder only need to produce one valid packet in every four clock cycles, or in other words, they are a four-cycle path component. Based on this property, the present invention can operate at a speed up to 400 Mhz even though the circuitry of the producer and the packet builder can only operate up to 100 MHz as shown in FIG. 6.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A built-in self-test (BIST) circuit for a direct RAMBUS DRAM comprising:

a producer for producing a sequence of memory commands, said sequence of memory commands capable of performing basic memory READ/WRITE operations and pipelined and interleaved READ/WRITE operations;

a packet builder for translating each memory command in said sequence of memory commands to a packet in a format compliant to the direct RAMBUS DRAM's specification, each packet containing eight individual packet slices;

a time-multiplexer for sequentially outputting the packet slices to be the test pattern;

a delay buffer for delaying an expected memory response; and a comparator for comparing the output responses of the memory device with the expected memory response to determine if the function of the direct DRAM is id correct.

2. The circuit of claim 1, wherein the producer is comprised of:

a first finite state machine for generating a sequence of instructions according to an underlying test algorithm;

a second finite state machine for translating an instruction of said sequence of instructions into a sequence of valid memory commands; and a master-slave synchronization mechanism for regulating the interaction of the first and second finite state machines.

3. The circuit of claim 1, wherein the producer and the packet builder are both multicycle path components that jointly generate only one valid packet in a predetermined number of clock cycles.

4. The circuit of claim 1, wherein the time-multiplexer raises a flag at the end of the process of a packet to ask the packet builder to generate the next packet for processing.

* * * * *